United States Patent [19]

Oizumi et al.

[11] 4,388,129

[45] Jun. 14, 1983

[54] PRODUCTION OF BUBBLE-FREE ELECTRICAL LAMINATES

[75] Inventors: Masayuki Oizumi, Ohtsu; Masaharu Abe, Kobe; Yasuo Fushiki, Takatsuki, all of Japan

[73] Assignee: Kanegafuchi Kagaku Kogyo Kabushiki Kaisha, Osaka, Japan

[21] Appl. No.: 304,692

[22] Filed: Sep. 22, 1981

[30] Foreign Application Priority Data

Sep. 22, 1980 [JP] Japan ............................ 55-132158
Sep. 25, 1980 [JP] Japan ............................ 55-134013

[51] Int. Cl.$^3$ ............................................. B32B 31/14
[52] U.S. Cl. ............................ 156/73.1; 156/73.6; 156/87; 156/286; 156/307.4; 156/307.7; 156/382; 264/69; 264/258; 264/344; 428/901
[58] Field of Search ............... 156/73.1, 87, 307.4, 156/307.7, 286, 382, 73.6; 264/69, 102, 257, 258, 344; 428/901

[56] References Cited

U.S. PATENT DOCUMENTS 3,291,672  12/1966  Sonneborn et al. .............. 156/87 X
3,746,589   7/1973  Reinke ................................ 156/73.6
3,897,588   7/1975  Nohtomi ......................... 156/315 X

FOREIGN PATENT DOCUMENTS 3021106  1/1981  Fed. Rep. of Germany ...... 264/102

Primary Examiner—Robert A. Dawson
Attorney, Agent, or Firm—Haight & Associates

[57] ABSTRACT

Bubble- or void-free electrical laminates such as unclad or metal clad laminates are produced by impregnating a porous fibrous substrate with a solvent-free liquid resin capable of curing to a rigid state without producing a volatile by-product, combining a plurality of impregnated substrates to form a unitary member, allowing substantially all of entrapped air bubbles retained in the combination to disappear by dissolving into the liquid resin, and then curing the combination.

10 Claims, No Drawings

PRODUCTION OF BUBBLE-FREE ELECTRICAL LAMINATES

BACKGROUND THE INVENTION

This invention relates to a process for producing reinforced resin laminate for electrical uses such as insulating boards and printed circuit wiring boards.

The batch-type process commonly used in the manufacture of such laminates includes the steps of impregnating a porous fibrous substrate with a resin varnish in a volatile solvent, evaporating the solvent to prepare a prepreg, stacking a plurality of prepregs, and curing the stack under heat and pressure in a mold. Metal clad laminates may be prepared in a similar manner by placing a cladding metal foil on one or both sides of the stack in the mold. This batch-type process naturally requires large amount of hand labor and expensive production equipments and is, therefore, not highly productive. The use of solvent produces major safety and environmental problems.

For these and other reasons, the use of solvent-free liquid resins which are capable of curing to a solid state without producing volatile byproducts is an attractive materials for resin laminates, particularly when the manufacturing process is to be carried out in continuous mode. These liquid resins may be cured in a the absence of molding pressure and thus the difficulty of pressing a length of continuously moving green laminate may be avoided.

One serious problem which has been experienced in the production of electrical laminates from such liquid resins is the fact that fine air and other gas bubbles are unavoidably retained in the substrate and the resulting laminate includes a number of fine bubbles or voids therein. The presence of air bubbles or voids will greatly impair the performance of the finished product. For example, the thermal conductivity of the laminate would be decreased by these bubbles resulting in a decrease of heat resistance such as solder dip resistance. In case of clad laminates for use in the production of printed circuit boards, the presence of bubbles or voids weakens the bond between the insulating layer and the cladding metal foil layer and also produces inaccurate conductive patterns upon etching.

Therefore, it is an object of this invention to provide a process for producing electrical laminates, either unclad or clad, which are substantially free of bubbles or voids produced from entrapped air or other gases, from a porous fibrous substrate and a solvent-free liquid resin capable of curing to a rigid state without producing a volatile byproduct.

It is another object of the present invention to provide a process which is highly adapted to practice in the continuous mode for producing bubble-free electrical laminates having improved characteristics.

Other objects and advantages of the present invention will be apparent as the description proceeds.

DESCRIPTION OF THE INVENTION

According to the present invention, electrical laminates are produced by impregnating a porous fibrous substrate with a solvent-free liquid resin capable of curing to a rigid state without producing a volatile product, combining a plurality of impregnated substrates to form a unitary member, allowing substantially all of entrapped air bubbles retained in the combination to disappear by dissolving into the liquid resin, and then curing the combination.

In a preferred embodiment, the combination of a plurality of substrates is sandwiched between a pair of covering sheets and then cured in place between said pair of covering sheets without applying molding pressure. One or both of the covering sheets may be a cladding metal foil which becomes an integral part of a metal clad laminate after the completion of entire process. This embodiment is highly adapted to practice the process in a continuous mode.

It is important for the present invention that the combined substrates or green laminate is subjected to the curing step only after entrapped bubbles have substantially disappeared by dissolving into the liquid resin. Experiments have shown that the entrainment of air bubbles within the substrate occurs unavoidably for various reasons when solvent-free, viscous liquid resins are used for impregnating the substrate. The major reason is the fact that fibers constituting the substrate structure are not thoroughly wetted by the liquid resin and the interstices between fibers are not fully filled with the liquid resin. The degree of entrainment of air bubbles depends on many factors such as the affinity between substrate and liquid resin, resin viscosity, manner of impregnation, impregnation time and the like. In order to achieve the advantage of the present invention to the fullest extent, it is, therefore, desirable to select an optimal condition for each of these factors.

Several procedures may be employed for dissolving entrapped air bubbles into the liquid resin phase of green laminates. First, air bubbles may be eliminated by standing the combined substrates or green laminate for a sufficient length of time. This time may be shortened by applying ultrasonic waves to the green laminate or placing the green laminate in compressed air. Use of degassed liquid resins whose dissolved oxygen level is less than 8 ppm is also effective for promoting the dissolution of air bubbles into the liquid resin phase. Since the solubility of a gas in a liquid is, in general, inversely proportional to the temperature, higher temperature should be avoided during this period.

Any conventional porous fibrous substrate may be used in the present invention. Examples thereof include woven and nonwoven fabrics made of glass fiber or asbestos, natural or synthetic fibers, papers made of cellulosic fibers such as kraft pulp and cotton linter pulp.

A variety of liquid resins may be used. Examples of usable liquid resins include unsaturated polyester resins, vinyl ester resins (DERAKENE), diallyl phthalate resins, epoxy resins and similar resinous compounds. These resins occur as liquids at room temperature and do not contain a volatile component such as a solvent. Also they are capable of curing to a rigid state without producing a volatile byproduct such as water. It is contemplated that usable resins include the thermosetting type and the type which cures upon exposure to irradiation of an ionizing ray such as UV light, electron ray, gamma ray and the like.

In one preferred embodiment, liquid unsaturated polyester resins are employed. As is well-known, unsaturated polyester resins comprise a mixture of a condensate of saturated polycarboxylic acid such as phthalic, isophthalic, terephthalic, adipic or sebacic acid, an unsaturated acid such as maleic, fumaric or itaconic acid, and a polyol such as ethylene glycol, propylene glycol, diethylene glycol or butanediol, with a cross-linking monomer such as styrene, vinyltoluene, methyl methacrylate, diallyl phthalate or divinylbenzene. Flame retarding unsaturated polyester resins having chlorine, bromine or phosphorus atoms in the molecule of component reactants may also be used.

It has been found that many commercially available unsaturated polyester resins contain a relatively large amount of dissolved air in terms of dissolved oxygen greater than 8 ppm. The level of dissolved air in these products may be decreased to lower than 8 ppm in terms of dissolved oxygen by degassing under vacuum. Since the vapor pressures of cross-linking monomers are relatively low, only a slight amount of the monomer is lost during the degassing treatment. For example, the loss of styrene monomer ranges only 0.1 to 0.5% by weight based on the total liquid resin during the degassing treatment at a vacuum of 2 to 40 mmHg.

Unsaturated polyester resins having dissolved oxygen levels lower than 8 ppm may also be obtained with the following cautions:

(a) selecting suitable reaction components having lower levels of dissolved air, (b) decreasing air concentration in the reactor, (c) purging the reaction mixture with a rear gas such as helium or neon gas, and (d) mixing the reaction mixture with curing catalyst, filler or other additives under vacuum.

Normally, nitrogen gas may be dissolved in the resin composition as much as oxygen although the detection of its presence in the resin is difficult. Experiments have shown that purging with nitrogen gas is ineffective in this case for reducing the amount of dissolved gas which would otherwise develop to gas bubbles in the finished laminate. Only rare gases such as helium or neon are effective to reduce the level of dissolved air from the resin.

Once the liquid resin has been treated in this way, its dissolved oxygen level remains below the upper limit upon exposure to the atmosphere for less than 60 minutes, and it may be used for the impregnation of fibrous substrate according to the present invention.

The resin may contain conventional curing catalysts, flame-retardants, fillers and other additives. Curing may be carried out by heat or irradiation of an ionizing ray.

Production of laminates in accordance with the present invention may be carried out in any known manner using any known apparatus except that the green laminate is cured after substantially all of entrapped bubbles have been eliminated. One such method of continuous mode is disclosed in Japanese Unexamined Patent Publication No. 4838/1975 assigned to the same assignee as the present application.

The invention is further illustrated by the following examples in which all parts and percents are by weight.

EXAMPLE 1

A commercial kraft paper (MKP-150, Tomoegawa Paper Co., Ltd.) was treated with an aqueous solution of methylolmelamine to give a pick-up amount of 11% by weight of paper on a dry basis. The treated paper was impregnated with a commercial liquid unsaturated polyester resin having a viscosity of 4 poise (POLYMAL 6304, Takeda Chemical Industries, Ltd.) containing 1% of cumene hydroperoxide catalyst by pouring the liquid resin onto the upper side of paper. Immediately, five such paper sheets were stacked into a green laminate without entrapping air bubbles between the paper sheet layers. At this time many fine bubbles were observed in the interior of the green laminate which disappeared after standing the green laminate for 40 minutes. Then the green laminate was cured at 100° C. for 1 hour to give an unclad laminate 1.6 mm thick. Substantially no bubbles were observed in the interior of finished laminate.

When the green laminate was cured immediately after its formation, many fine bubbles were observed in the finished laminate.

EXAMPLE 2

A mixture of 100 parts of commercial liquid unsaturated polyester resin (POLYMAL 6304, Takeda Chemical Industries, Ltd.), 1 part of cumene hydroperoxide and 0.2 parts of 6% cobalt naphthenate was poured dropwise into a stainless steel vacuum chamber within which a vacuum of 5 mmHg was created.

Six continuous lengths of commercial kraft paper (MKP-150, Tomoegawa Paper Co., Ltd.) were conveyed in generally horizontal direction in parallel, impregnated with the degassed liquid resin by pouring the liquid resin onto the upper side of the paper, and combined into a green laminate. Then green laminate was covered with a pair of polyester films 50 $\mu$m thick on the upper and lower sides, and passed through a tunnel oven at 120° C. requiring 45 minutes to obtain a fully cured laminate 1.6 mm thick. The impregnation time was 5 minutes.

A small test piece was cut from the resulting laminate and observed by a field microscope. Also, a thin slice was prepared by slicing the test piece embedded in an epoxy potting compound, and observed by a 100 fold transmission microscope. No bubble was observed in the interior of the substrate by these two methods.

The dissolved oxygen level of degassed liquid resin used was determined by Ohashi's oxygen meter M-1 (Oriental Electric Co., Ltd.) and found to be 5.8 ppm. The calibration of oxygen level was made against air (21%) and reading of oxygen level in the sample resin was made when the meter indicated a constant value for 5 minutes while immersing the electrode in the sample.

The above described procedure was repeated except that the liquid resin was not preliminarily degassed (dissolved oxygen level 11.4 ppm) or partly degassed (9.5 ppm) under a vacuum of 150 mmHg. In both cases, a number of fine bubbles of 5 to 50$\mu$ size were observed in the resultant laminate.

EXAMPLE 3

The liquid resin formulation used in Example 2 was placed in a tank and deaerated by blowing helium gas into the resin at the bottom of tank for 30 minutes.

Then the procedure of Example 2 was repeated with this liquid resin to obtain a laminate 1.6 mm thick. substantially no bubble or void was observed in the interior of the finished laminate. The dissolved oxygen level of liquid resin used was 7.7 ppm.

The above has been offered for illustrative purposes only, and is not for the purpose of limiting the scope of this invention which is defined in the claims below.

We claim:

1. A process for producing bubble-free electrical laminates which comprises the steps of impregnating a porous fibrous substrate with a solvent-free, liquid resin capable of curing to a rigid state without producing a volatile by-product combining a plurality of impregnated substrates to form a green laminate, allowing said green laminate to stand prior to the curing step for a sufficient length of time and applying ultrasonic waves thereto to dissolve substantially all of the entrapped air bubbles into said liquid resin phase, and then curing the green laminate.

2. The process of claim 1 wherein said liquid resin is an unsaturated polyester resin having a dissolved oxygen level of lower than 8 ppm.

3. A process for producing bubble-free electrical laminates which comprises the steps of impregnating a porous fibrous substrate with a solvent-free, liquid resin capable of curing to a rigid state without producing a volatile by-product, combining a plurality of impregnated substrates to form a green laminate, allowing said green laminate to stand prior to the curing step and placing said green laminate in compressed air for a sufficient length of time to dissolve substantially all of the entrapped air bubbles into said liquid resin phase, and then curing the green laminate.

4. The process of claim 3 wherein said liquid resin is an unsaturated polyester resin having a dissolved oxygen level of lower than 8 ppm.

5. A process for producing bubble-free electrical laminates in continuous mode comprising the steps of impregnating a plurality of continuous lengths of porous fibrous substrates with a solvent-free, saturated polyester liquid resin having a dissolved oxygen level of lower than 8 ppm, combining said plurality of substrates into a unitary combination, sandwiching the combination between a pair of covering sheets, allowing the entrapped air bubbles retained in said combination to substantially disappear by dissolution into said liquid resin phase, and curing the combination in place between said pair of covering sheets.

6. The process of claim 5 wherein at least one of said pair of covering sheets is a cladding metal foil which becomes an integral part of the finished laminate.

7. The process of claim 5 wherein said fibrous substrate is paper.

8. The process of claim 7 wherein said paper is preliminarily treated with methylolmelamine.

9. The process of claim 7 wherein said curing step is carried out without applying molding pressure.

10. The process of claim 7 wherein said impregnation step is carried out at the atmospheric pressure.

* * * * *

UNITED STATES PATENT AND TRADEMARK OFFICE
CERTIFICATE OF CORRECTION

PATENT NO. : 4,388,129

DATED : June 14, 1983

INVENTOR(S) : Masayuki Oizumi et al.

It is certified that error appears in the above—identified patent and that said Letters Patent is hereby corrected as shown below:

Claim 5, line 4: Change "saturated" to --- unsaturated ---.

Signed and Sealed this

Seventeenth Day of September 1985

[SEAL]

Attest:

Attesting Officer

DONALD J. QUIGG

Commissioner of Patents and Trademarks—Designate